(12) United States Patent  (10) Patent No.: US 8,093,610 B2
Wilm et al.  (45) Date of Patent: Jan. 10, 2012

(54) OPTOELECTRONIC COMPONENT

(75) Inventors: Alexander Wilm, Singapore (SG);
Julius Muschaweck, Gauting (DE);
Moritz Engl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 124 days.

(21) Appl. No.: 12/443,305

(22) PCT Filed: Sep. 7, 2007

(86) PCT No.: PCT/DE2007/001611
§ 371 (c)(1),
(2), (4) Date: Jun. 1, 2009

(87) PCT Pub. No.: WO2008/040283
PCT Pub. Date: Apr. 10, 2008

(65) Prior Publication Data
US 2010/0012959 A1  Jan. 21, 2010

(30) Foreign Application Priority Data
Sep. 29, 2006 (DE) .................. 10 2006 046 199

(51) Int. Cl.
*H01L 33/00* (2010.01)
(52) U.S. Cl. ...... 257/98; 257/99; 257/103; 257/E33.001
(58) Field of Classification Search .............. 257/98, 257/99, 103, E33.001
See application file for complete search history.

(56) References Cited

U.S. PATENT DOCUMENTS

| 5,813,752 A | 9/1998 | Singer et al. |
| 5,813,753 A | 9/1998 | Vriens et al. |
| 6,066,861 A | 5/2000 | Hoehn et al. |
| 6,603,146 B1 | 8/2003 | Hata et al. |
| 6,616,862 B2 | 9/2003 | Srivastava et al. |
| 7,341,878 B2 * | 3/2008 | Krames et al. .............. 438/22 |
| 2003/0094893 A1 | 5/2003 | Ellens et al. |
| 2004/0062699 A1 | 4/2004 | Oshio |
| 2004/0116033 A1 | 6/2004 | Ouderkirk et al. |
| 2006/0057753 A1 | 3/2006 | Schardt et al. |

(Continued)

FOREIGN PATENT DOCUMENTS
CN  1805158 A  7/2006
(Continued)

OTHER PUBLICATIONS

Schnitzer, I., et al., "30% external quantum efficiency from surface textured, thin-film light-emitting diodes," Applied Physics Letters 63, Oct. 18, 1993, pp. 2174-2176, American Institute of Physics.

(Continued)

*Primary Examiner* — Tan N Tran
(74) *Attorney, Agent, or Firm* — Slater & Matsil, L.L.P.

(57) ABSTRACT

An optoelectronic component with a desired color impression in the switched-off state includes, in particular, a semiconductor layer sequence with an active region, that during operation radiates electromagnetic radiation with a first spectrum, and a wavelength conversion layer that is disposed downstream from the semiconductor layer sequence in the beam path of the electromagnetic radiation with the first spectrum, and that at least partially converts a subspectrum of the electromagnetic radiation with the first spectrum into electromagnetic radiation with a second spectrum, and a filter layer that reflects at least a part of the radiation incident from outside onto the optoelectronic component.

23 Claims, 3 Drawing Sheets

U.S. PATENT DOCUMENTS

| | | |
|---|---|---|
| 2006/0071223 A1 | 4/2006 | Richter et al. |
| 2006/0091779 A1 | 5/2006 | Takeda et al. |
| 2006/0171152 A1 | 8/2006 | Suehiro et al. |
| 2006/0208268 A1* | 9/2006 | Ueno et al. .................. 257/98 |
| 2009/0103297 A1 | 4/2009 | Bogner et al. |

FOREIGN PATENT DOCUMENTS

| | | |
|---|---|---|
| CN | 1835257 A | 9/2006 |
| DE | 196 38 667 A1 | 4/1998 |
| DE | 101 42 009 A1 | 3/2003 |
| DE | 10142009 * | 3/2003 |
| DE | 101 47 040 A1 | 4/2003 |
| EP | 1 403934 A2 | 3/2004 |
| EP | 1 411 557 A2 | 4/2004 |
| EP | 1 643 567 A2 | 4/2006 |
| WO | WO 00/33390 | 6/2000 |
| WO | WO 2006/089508 A1 | 8/2006 |
| WO | WO-20006089508 * | 8/2006 |

OTHER PUBLICATIONS

State Intellectual Property Office of People's Republic of China, Notification of the First Office Action, Application No. 200780036069.8, OSRAM Opto Semiconductor GMBH, Sep. 29, 2006, 7 pages.

* cited by examiner

OPTOELECTRONIC COMPONENT

This patent application claims the priority of the German patent application 10 2006 046 199.1 filed Sep. 29, 2006, whose disclosed content is hereby incorporated by reference.

BACKGROUND

The present invention relates to an optoelectronic component that can emit electromagnetic radiation during operation, and in the switched-off state has a desired color impression.

SUMMARY

Embodiments of the present invention disclose an optoelectronic component with a wavelength conversion layer that in a switched-off state can reduce or prevent an undesired color impression.

An optoelectronic component according to one particular embodiment of the invention comprises, a semiconductor layer sequence with an active region that, during operation, emits electromagnetic radiation with a first spectrum. A wavelength conversion layer is disposed downstream from the semiconductor layer sequence in the beam path of the electromagnetic radiation with the first spectrum. The wavelength conversion layer at least partially converts electromagnetic radiation with the first spectrum into electromagnetic radiation with a second spectrum. A filter layer reflects at least a part of a radiation incident from outside onto the optoelectronic component.

In particular, during operation of the electromagnetic component an emitted electromagnetic radiation can be perceived by an outside observer. This radiation can correspond to a superposition of the part of the electromagnetic radiation with the first spectrum that is not converted by the wavelength conversion layer, and the electromagnetic radiation with the second spectrum.

In a further embodiment, the radiation incident from outside onto the optoelectronic component corresponds to an electromagnetic radiation that is not emitted from the active region. This can mean that the electromagnetic radiation incident from outside onto the optoelectronic component can be, for example, ambient radiation, in particular, ambient light. Such ambient radiation can be, for example, solar radiation, in particular, sunlight, or also electromagnetic radiation that is emitted from artificial light sources.

In a further embodiment of the invention, "spectrum" or "subspectrum" signifies a spectral distribution of electromagnetic radiation with at least one spectral component with one wavelength or multiple spectral components with several wavelengths and/or wavelength ranges. In the following, a first spectrum and a second spectrum are equivalent when the spectral components and their relative intensities are equal in the case of the first and second spectrum, wherein the absolute intensity of the first spectrum can deviate from the absolute intensity of the second spectrum.

In an embodiment of the invention, "partial" signifies a subspectrum of a spectrum, for example, the first spectrum. In particular, the subspectrum of a spectrum can be composed of one part of the spectral components of this spectrum. Furthermore, "partial" can signify also a part of an intensity of a spectrum or subspectrum.

In a further embodiment of the invention, "convert" can signify that the subspectrum of the electromagnetic radiation with the first spectrum, which is converted by the wavelength conversion layer at least partially into electromagnetic radiation with the second spectrum, and the second spectrum are not equal. In particular, this can mean that the second spectrum comprises a spectral distribution that differs from the spectral distribution of the subspectrum of the electromagnetic radiation with the first spectrum.

Furthermore, the wavelength conversion layer can comprise an absorption spectrum and an emission spectrum, wherein the absorption spectrum and the emission spectrum advantageously are not equal. Here, the absorption spectrum preferably comprises the subspectrum of the electromagnetic radiation with the first spectrum and the emission spectrum comprises the second spectrum. In particular, the absorption spectrum and the emission spectrum can each comprise further spectral components that are not included in the subspectrum of the electromagnetic radiation with the first spectrum, or the second spectrum.

Now, if electromagnetic radiation with a specific wavelength is incident from outside or from the active region of the semiconductor layer sequence onto the wavelength conversion layer, and if the absorption spectrum comprises a spectral component with this specific wavelength that can be absorbed by the wavelength conversion layer, then, the electromagnetic radiation with this specific wavelength is emitted again, i.e. re-emitted, as electromagnetic radiation with one or more different wavelengths that differ from said specific wavelengths, which are included in the emission spectrum. This means, in particular, that even with radiation incident from outside onto the optoelectronic component, it can be possible that in a switched-off state of the optoelectronic component, the wavelength conversion layer according to its absorption spectrum and its emission spectrum, due to radiation incident from outside onto the optoelectronic component which can be reflected or radiated by a described absorption and re-emission process, can convey a color impression, which viewed on its own can be considered undesirable to an observer. This color impression can, for example, be undesirable due to the fact that it can be different from the color impression of the emitted electromagnetic radiation of the optoelectronic component during operation.

The filter layer can be particularly advantageous in so far as the filter layer can reflect a part of the radiation incident from outside onto the optoelectronic component, and said part of the reflected radiation is superposed with the color impression originating from the wavelength conversion layer, and can be perceived by an observer. In the process, the said superposition can advantageously facilitate a desired color impression to the observer. In particular, it can be advantageous if the part of the radiation incident from outside onto the optoelectronic component that is reflected by the filter layer together with the color impression caused solely by the wavelength conversion layer, creates a color impression to an observer by superposition that corresponds to the color impression of the radiation incident from outside onto the optoelectronic component.

In a further preferred embodiment, the filter layer is disposed downstream of the wavelength conversion layer in the beam path of the electromagnetic radiation with the first spectrum. In particular, the beam path of the electromagnetic radiation with the second spectrum can also correspond to the beam path of the electromagnetic radiation with the first spectrum, so that the filter layer can preferably also be disposed downstream of the wavelength conversion layer also in the beam path of the electromagnetic radiation with the second spectrum.

Furthermore, the optoelectronic component can comprise a radiation output surface in the beam path of the electromagnetic radiation with the first spectrum and with the second spectrum. Here, the radiation incident from outside onto the optoelectronic component can be incident onto the radiation output surface.

In a further preferred embodiment of the invention, the filter layer is transparent for a part of the electromagnetic radiation with the first spectrum. In particular, then, electromagnetic radiation with the first spectrum that is not converted by the wavelength conversion layer into electromagnetic radiation with the second spectrum can be emitted from the optoelectronic component.

In a further embodiment, the first spectrum comprises at least one spectral component from an ultraviolet to infrared wavelength range. Preferably, the first spectrum comprises a visible wavelength range. In particular, this can mean that during operation, the semiconductor layer sequence emits visible electromagnetic radiation, that is, visible light. Here, "visible" can, in particular, mean perceptible to the human eye, i.e., to an observer, which means a wavelength range of about 380 nanometers to about 800 nanometers. In a further preferred embodiment, the first spectrum comprises an ultraviolet to blue wavelength range.

Furthermore, in a further preferred embodiment, in particular, the part of the radiation incident from outside onto the optoelectronic component that is reflected by the filter layer comprises a visible wavelength range. It can be particularly advantageous if the part of the radiation incident from outside onto the optoelectronic component that is reflected by the filter layer corresponds at least partially to the subspectrum of the electromagnetic radiation with the first spectrum that is converted by the wavelength conversion layer. This can also mean, in particular, that the spectrum of the part of the radiation incident from outside onto the optoelectronic component that is reflected by the filter layer includes the said subspectrum, or coincides with it.

Therefore, it can also be possible that the filter layer at least partially reflects back in the direction of the wavelength conversion layer the part of the electromagnetic radiation that is not converted by the wavelength conversion layer into electromagnetic radiation with the second spectrum. The possibility exists for this electromagnetic radiation that is reflected back, that it in turn can be converted at least partially by the wavelength conversion layer. Thus, in particular, the filter layer can also be suited to increasing the part of the subspectrum of the electromagnetic radiation with the first spectrum that is converted by the wavelength conversion layer. However, it can be particularly advantageous if the filter layer is transparent for at least a part of the first radiation, such that this part can be emitted by the optoelectronic component.

Furthermore, the spectrum of the part of the radiation incident from outside onto the optoelectronic component that is reflected by the filter layer can comprise, for example, further spectral components of the absorption spectrum of the wavelength conversion layer, or it can include the absorption spectrum, or coincide with it.

In a particularly preferred embodiment, the first spectrum comprises a blue wavelength region, and the second spectrum comprises a yellow wavelength region. Here, the part of the electromagnetic radiation with the first spectrum that can be converted by the wavelength conversion layer into electromagnetic radiation with the second spectrum, can advantageously be selected in such a way that the optoelectronic component preferably creates an impression of white light to an observer during operation, in particular, however, by the fact that a further part of the electromagnetic radiation with the first spectrum can also be radiated by the optoelectronic component. In particular, a correspondingly designed wavelength conversion layer in the switched-off state of the component can, when radiation is incident from outside onto the optoelectronic component, convey a yellowish color impression to an observer. Therefore, the filter layer can be specifically suited to reflecting a part of the radiation incident from outside onto the optoelectronic component, so that the optoelectronic component when in a switched-off state can convey to an observer a non-yellowish color impression, but instead, for example, a white color impression. This can be possible due to the fact that the filter layer can at least partially reflect a blue spectral region of the radiation incident from outside onto the optoelectronic component.

In particular, such an embodiment can be advantageous for applications in which light emitting components are used with light emitting diodes (LEDs), for example, as a flash light in mobile telephone applications with cameras. For example, such light emitting components can comprise blue LEDs and a phosphor conversion substance. In this case it is possible that the phosphor conversion substance is visible from the outside through a transparent cover or a lens when such a light emitting component is not in operation, which can lead to an undesired color impression, for example, for aesthetic reasons. Such an undesired color impression can indeed be reduced through Fresnel lenses or microlens arrays, however, an adverse color impression can persist.

Alternatively or additionally, the first spectrum can also comprise, for example, a green wavelength region, and the second spectrum can comprise a red wavelength region, so that the optoelectronic component can also create during operation a white light impression to an observer. In particular, the first spectrum, the second spectrum, the subspectrum, and the part of the radiation incident from outside onto the optoelectronic component reflected by the filter layer, can also be selected corresponding to a different desired color impression during operation and in the switched-off state, respectively, of the optoelectronic component.

In a further embodiment the semiconductor layer sequence is implemented as an epitaxial layer sequence, that is, as an epitaxially grown semiconductor layer sequence.

In this case, the semiconductor layer sequence can be implemented, for example, based on an inorganic material, such as InGaAlN, in the form of, for example, a GaN thin-film semiconductor layer sequence. InGaAlN-based semiconductor layer sequences include, in particular, those in which the epitaxially produced semiconductor layer sequence, which as a rule comprises a layer sequence of different individual layers, contains at least one individual layer that comprises a material from the III-V compound semiconductor material system $In_xAl_yGa_{1-x-y}N$ with $0 \leq x \leq 1$, $0 \leq y \leq 1$ and $x+y \leq 1$.

Alternatively or additionally, the semiconductor layer sequence can also be based on InGaAlP, i.e., the semiconductor layer sequence comprises different individual layers, of which at least one individual layer comprises a material from the III-V compound semiconductor material system $In_xAl_yGa_{1-x-y}P$ with $0 \leq x \leq 1$, $0 \leq y \leq 1$ and $x+y \leq 1$. Alternatively or additionally, the semiconductor layer sequence can also comprise other III-V compound semiconductor material systems, for example, an AlGaAs based material, or II-VI compound semiconductor material systems.

In particular, the semiconductor layer sequence can also be implemented as a semiconductor chip, and comprise a substrate.

In a further embodiment, the semiconductor layer sequence is a thin film semiconductor layer sequence. A thin film semiconductor layer sequence can be distinguished, in particular, by the following characteristic features:

a reflecting layer is applied to or formed on a first main surface, facing towards a supporting element, of a radiation generating epitaxial layer sequence, where said reflecting layer reflects at least a part of the electromagnetic radiation generated in the epitaxial layer sequence back into said layer sequence;

the epitaxial layer sequence comprises a thickness in the range of 20 µm or less, in particular, in the range of 10 µm, and the epitaxial layer sequence comprises at least one semiconductor layer with at least one surface that comprises a mixing structure that in the ideal case leads to a nearly ergodic distribution of the light in the epitaxial layer sequence, i.e., it comprises stochastic scattering behavior that is as ergodic as possible.

A basic principle of a thin layer semiconductor chip is described, for example, in I. Schnitzer, et al., Applied Physics, Lett. 63 (16), Oct. 18, 1993, 2174-2176, whose disclosure content in this regard is hereby incorporated by reference.

Furthermore, the semiconductor layer sequence can comprise, or can be, an organic layer or semiconductor layer sequence, and can be implemented for example, in particular, as an organic light emitting diode (OLED). Here, an OLED can comprise an organic layer or a layer sequence with at least one organic layer with an active region that can emit electromagnetic radiation during operation. Furthermore, an OLED can comprise a first electrode and a second electrode, wherein the organic layer or the layer sequence with at least one organic layer with the active region can be disposed between the first and second electrode. Here, the first and the second electrode can be suited to inject "holes" or electrons respectively into the active region that can recombine there while emitting electromagnetic radiation.

Furthermore, the first electrode can be disposed on a substrate. The organic layer or the layer sequence with one or more functional layers composed of organic materials can be applied above the first electrode. Here, the functional layers, which can comprise the active region, can have, for example, electron transport layers, electroluminescent layers and/or hole transport layers. The second electrode can be applied over the functional layers or, respectively, above the at least one organic layer.

For example, the substrate can comprise glass, quartz, plastic films, metal, metal films, silicon wafers, or any other suitable substrate material as desired. For example, the substrate can be implemented also as a layer sequence or laminate of multiple layers. If the semiconductor layer sequence is implemented as a so-called "bottom emitter", that is, the electromagnetic radiation generated in the active region can be radiated through the substrate, then the substrate can advantageously comprise a transparency for at least a part of the electromagnetic radiation. Here, the wavelength conversion layer and the filter layer can be disposed on a side of the substrate facing away from the semiconductor layer sequence.

According to at least one embodiment, at least one of the electrodes comprises a transparent conductive oxide, a metal, or a conductive organic material, or is composed of such a material.

In the bottom emitter configuration, advantageously, the first electrode can be transparent for at least a part of the electromagnetic radiation. A first transparent electrode, which can be implemented as an anode and thus can serve as a material injecting positive charges or "holes", can comprise, for example, a transparent conductive oxide, or be composed of a transparent conductive oxide. Transparent conducting oxides (TCO) are transparent conducting materials, in general, metal oxides, for example zinc oxide, tin oxide, cadmium oxide, titanium oxide, indium oxide or indium tin oxide (ITO). Along with binary metal oxide compounds, such as $ZnO$, $SnO_2$ or $In_2O_3$, the ternary metal oxide compounds, such as $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of various transparent conducting oxides, belong to the group of TCOs. Furthermore, the TCOs do not necessarily need to correspond to a stoichiometric composition, and can also be p-doped or n-doped. Alternatively or additionally, the first electrode can also comprise a metal, for example, silver.

The semiconductor layer sequence with at least one organic layer can comprise polymers, oligomers, monomers, organic small molecules, or other organic non-polymer compounds or combinations thereof. In particular, it can be advantageous if a functional layer of the layer sequence is implemented as a hole transport layer in order to facilitate an effective hole injection into an electroluminescent layer or an electroluminescent region. Such structures pertaining to the active region or the further functional layers and regions, are known to the person skilled in the art, in particular, with regard to materials, construction, function and structure, and therefore are not described here in more detail.

The second electrode can be implemented as a cathode, and thus, serve as an electron inducing material. In particular, among others, aluminum, barium, indium, silver, gold, magnesium, calcium, or lithium, as well as, compounds, combinations and alloys thereof, can prove advantageous as a cathode material. Additionally or alternatively, the second electrode can also be implemented transparently. This means, in particular, that the OLED can be implemented also as a "top emitter", that is, that the electromagnetic radiation generated in the active region can be emitted on the side of the semiconductor layer sequence facing away from the substrate. Here, the wavelength conversion layer and the filter layer can be disposed above the semiconductor layer sequence, and in particular, above the second electrode.

If an electrode that comprises the metal layer, or is composed of such a layer, is to be constructed permeable for the light emitted from the organic layer stack, it can be advantageous, if the metal later is constructed sufficiently thinly. Preferably, the thickness of such a semitransparent metal layer is between 1 nm and 100 nm, wherein the limits are included.

Furthermore, the first electrode can be implemented as a cathode and the second electrode as an anode, wherein here, the semiconductor layer sequence can be implemented as a bottom or top emitter. Also, the semiconductor layer sequence can be implemented as a top emitter and as a bottom emitter at the same time.

The semiconductor layer sequence can comprise as an active region, for example, a conventional pn junction, a double heterostructure, a single quantum well structure (SQW structure) or a multiple quantum well structure (MQW structure). The semiconductor layer sequence can, in addition to the active region, comprise further functional layers and functional regions, such as, p or n doped charge carrier transport layers, that is, electron or hole transport layers, p or n doped confinement or cladding layers, buffer layers and/or electrodes, as well as combinations thereof. Such structures pertaining to the active region or the further functional layers and regions, are known to the person skilled in the art, in particular, with regard to materials, construction, function and structure, and therefore are not described here in more detail.

In a further embodiment, the wavelength conversion layer comprises at least one wavelength conversion substance. The wavelength conversion substance can comprise, for example, particles from the group of cerium doped garnets, in particular, cerium doped yttrium aluminum garnet $Y_3Al_5O_{12}$:Ce, (YAG:Ce), cerium doped terbium aluminum garnet (TAG:Ce), cerium doped terbium yttrium aluminum garnet (TbYAG:Ce), cerium doped gadolinium Yttrium aluminum garnet (GdYAG:Ce) and cerium doped gadolinium terbium yttrium aluminum garnet (GdTbYAG:Ce). Further possible wavelength conversion substances can be, for example, the following:

- garnets of rare earths and alkaline earth metals, such as described, for example, in the patent document US 2004/0062699 A1, whose disclosure content in this regard is incorporated by reference,
- nitrides, SiONes, and SiAlONes, such as described, for example, in the patent document DE 10147040 A1, U.S. Pat. No. 6,670,748, whose disclosure content in this regard is incorporated by reference,
- orthosilicates, sulfides, and vanadates, such as described, for example, in the patent document WO 00/33390 A1, whose disclosure content in this regard is incorporated by reference,
- chlorosilicates, such as described, for example, in patent document DE 10036940 A1, U.S. Pat. No. 7,064,480, whose disclosure content in this regard is incorporated by reference,
- aluminates, oxides, halophosphates, such as described, for example, in the patent document U.S. Pat. No. 6,616,862 B2, whose disclosure content in this regard is incorporated by reference.

Furthermore, the wavelength conversion layer can also comprise suitable mixtures and combinations of the named wavelength conversion substances.

Furthermore, the wavelength conversion layer can comprise a transparent matrix material, wherein the wavelength conversion substance can be embedded in the matrix material, or chemically bound to it. The transparent matrix material can, for example, comprise a transparent plastic, such as, silicones, epoxides, acrylates, imides, carbonates, olefins or derivatives thereof. Here, the wavelength conversion layer can be implemented as a film. Furthermore, the wavelength conversion layer can also be applied onto a substrate that comprises, for example, glass or a transparent plastic.

In a further embodiment, the wavelength conversion layer comprises an electrically conductive transparent layer on a side facing towards the semiconductor layer sequence. In particular, it can be advantageous if the wavelength conversion layer is applied directly on the semiconductor layer sequence, and is in direct contact with it. Thus, due to the electrically conductive, transparent layer, for example, an electrical contact with the semiconductor layer sequence is enabled.

The electrically conductive transparent layer can comprise, for example, a transparent electrically conductive oxide. A transparent, conductive oxide (TCO) can comprise, as described above, in general metal oxides, for example zinc oxide, tin oxide, cadmium oxide, titanium oxide, indium oxide or indium tin oxide (ITO) as a transparent, conductive material. Along with binary metal oxide compounds, such as ZnO, $SnO_2$ or $In_2O_3$, the ternary metal oxide compounds, such as $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of various transparent conducting oxides, belong to the group of TCOs. Furthermore, the TCOs do not necessarily comprise a stoichiometric composition, and can also be p-doped or n-doped. Furthermore, the electrically conductive transparent layer can also comprise a metal.

In a further embodiment, the filter layer is constructed as a dichroic mirror. In particular, the filter layer can comprise for this purpose, a periodic sequence of first and second layers. In addition, the layers can comprise dielectric materials, such as, oxides, nitrides and/or sulfides. Here, the first layers can have a first refractive index and the second layers can have a second refractive index, wherein the first refractive index differs from the second refractive index. For example, the first layers can have a lower refractive index than the second layers and, for instance, comprise silicon dioxide. Furthermore, the second layer can have a higher refractive index, such as, titanium dioxide, zirconium dioxide, or tantalum pentoxide. Additional suitable materials can be, for example, aluminum oxide or silicon nitride. Here, the thicknesses of the first and second layers can, for example, comprise approximately a quarter of the wavelength of a spectral component to be reflected. In addition, "thickness" can mean, in particular, the optical path length of the electromagnetic radiation in a first or second layer. Here, the thicknesses of different first layers, or second layers, can be equal. Alternatively or additionally, thicknesses of different first layers, or of different second layers, can differ. Depending on the degree of reflection to be attained by the filter layer, it can comprise one pair, or multiple pairs, of a first and second layer.

In a further embodiment, the filter layer can comprise a main surface, wherein the main surface of the filter layer can be the surface of the filter layer that is facing away from the semiconductor layer sequence and the wavelength conversion substance. This main surface can, for example, be the radiation output surface of the optoelectronic component. The radiation incident from outside onto the optoelectronic component can, for example, enclose an angle with the main surface. Here, it is possible that the part of the radiation incident from outside onto the optoelectronic component is reflected by the filter layer depending on its angle.

The filter layer can have, for example, a substrate comprising glass or plastic. Furthermore, the filter layer can be applied onto the wavelength conversion layer. In particular, it can be advantageous for this purpose if the wavelength conversion layer is constructed as a film. Alternately or additionally, the wavelength conversion layer can be a component of a layer arrangement that comprises a substrate with two main surfaces facing away from each other, wherein a wavelength conversion substance can be applied onto the one main surface, and the filter layer onto the other main surface.

In a further embodiment, the optoelectronic component can comprise an optical component, and the filter layer can be disposed on the optical component. An optical component can be, for example, a diffusing, focusing, collimating, or diffracting optical component, for example, a lens or a lens system, a covering, a diffuser, or a microprism structure or a combination thereof. In particular, the optical component can be spatially separated from the semiconductor layer sequence and the wavelength conversion layer, such that the filter layer can be spatially separated from the semiconductor layer sequence and the wavelength conversion layer. Here, "spatially separated" can mean, for example, that the filter layer is not in direct or indirect contact with the wavelength conversion layer.

BRIEF DESCRIPTION OF THE DRAWINGS

Further advantages and advantageous embodiments, and further developments of the subject matter according to the invention arise from the exemplary embodiments described in the following in connection with the Figures.

They show.

DETAILED DESCRIPTION

In the exemplary embodiments and Figures, equivalent components, or components that have the same effect, are designated in each case with the same reference numbers. The elements illustrated and their proportions are certainly not to be regarded as true to scale; rather, individual elements, for example, layers, can be represented in exaggerated thickness for better illustration and/or comprehension.

Figure 1A:
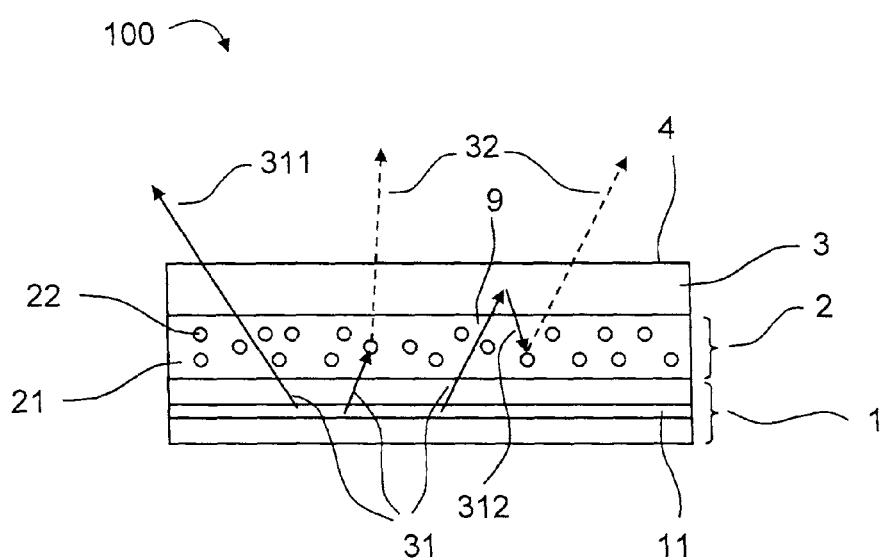
FIGS. 1A and 1B schematic illustrations of an optoelectronic component according to one exemplary embodiment in operation, and in the switched-off state, FIG. 2 a schematic illustration of an optoelectronic component according to a further exemplary embodiment, FIG. 3 a schematic illustration of an optoelectronic component according to a further exemplary embodiment, FIG. 4 a schematic illustration of an optoelectronic component according to a further exemplary embodiment, and FIG. 5 a schematic illustration of an optoelectronic component according to a further exemplary embodiment.
Figure 1B:
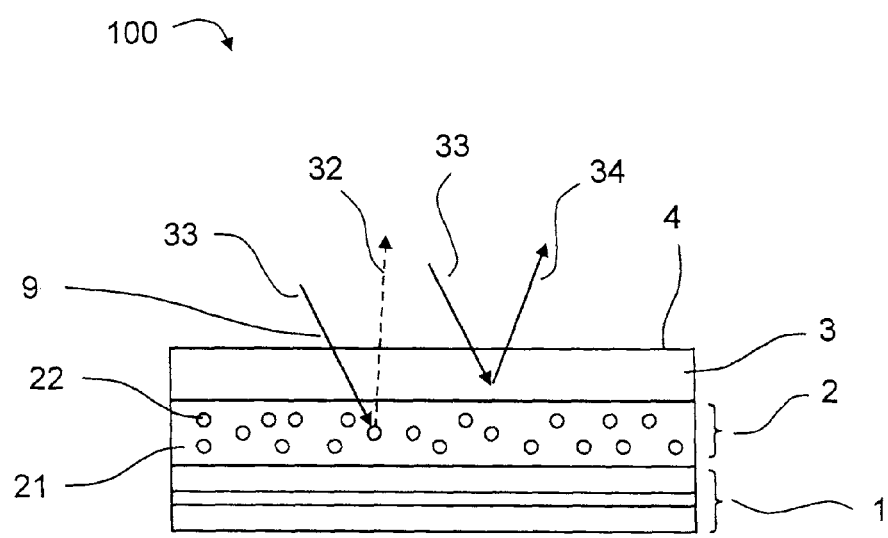

In the FIGS. 1A and 1B, an exemplary embodiment is shown for an optoelectronic component 100. There, in connection with FIG. 1A, the optoelectronic component 100 is described in operation, whereas FIG. 1B shows the optoelectronic component 100 in the switched-off state. The following description can relate equally to the FIGS. 1A and 1B.

The optoelectronic component 100 comprises a semiconductor layer sequence 1 with an active region 11. There, the semiconductor layer sequence 1 can have functional layers or layer sequences, as explained in the general part of the description, and can be implemented, for example, as a semiconductor chip or also as an OLED. In particular, the active region 11 of the semiconductor layer sequence 1 is suited to emitting electromagnetic radiation 31 with a first spectrum.

In the beam path of the electromagnetic radiation 31 with the first spectrum, a wavelength conversion layer 2 is disposed that comprises a wavelength conversion substance 22. As shown in the exemplary embodiment, the wavelength conversion substance 22 can be embedded, for example, in a matrix material 21. Here, the wavelength conversion substance 22 is suited to at least partially converting a subspectrum of the electromagnetic radiation 31 with the first spectrum into electromagnetic radiation 32 with a second spectrum. Here, materials suited for the wavelength conversion substance 22 can be, in particular, those materials having an absorption spectrum that contains at least one spectral component, in particular one wavelength range that is also contained in the first spectrum. Then, the absorbed electromagnetic radiation can preferably be re-emitted with a different wavelength than the electromagnetic radiation 31 with the first spectrum.

In the shown exemplary embodiment, a filter layer 3, above the wavelength conversion layer 2, is disposed in the beam path of the electromagnetic radiation 31 with the first spectrum and the electromagnetic radiation 32 with the second spectrum. The filter layer 3 can be suited to reflecting a part 34 of a radiation 33 incident onto the optoelectronic component from outside, during operation as well as in the switched-off state of the optoelectronic component 100, as is shown in FIG. 1B. In particular, the radiation 33 incident from outside onto the optoelectronic component 100 can be radiated onto a main surface 4 of the filter layer facing away from the wavelength conversion layer 2. Here, the main surface 4 can preferably be the radiation output surface of the optoelectronic component 100. In particular, the filter layer 3 can comprise a periodic sequence of first and second layers composed of dielectric materials, wherein the first layers have a first refractive index and the second layers have a second refractive index, and the first and the second refractive index differ from each other, as explained above in the general part.

In particular, the filter layer 3 can also be suited to reflecting at least a part 312 of the electromagnetic radiation 31 with the first spectrum. Here, the part 312 of the electromagnetic radiation 31 with the first spectrum reflected by the filter layer 3 can preferably be reflected back into the wavelength conversion layer 2, and can there be converted, for example by the wavelength conversion substance 22 into electromagnetic radiation 32 with the second spectrum.

For this, an arrangement of the filter layer 3 directly, or at least nearly on, the wavelength conversion layer 2 can be advantageous, in particular with respect to a compact construction of the optoelectronic component 100 and a homogeneous color impression of the optoelectronic component 100 both during operation, as well as in the switched-off state.

The color impression of the optoelectronic component 100 for an observer, created during its operation, results from the electromagnetic radiation emerging from the radiation output surface 4. Here, this can be a superposition of part 311 of the electromagnetic radiation 31 with the first spectrum, which can emerge from the optoelectronic component, and the electromagnetic radiation 32 with the second spectrum, which is emitted by the wavelength conversion layer 2. In particular, the color impression created depends on the relative intensities of the part 311 of the electromagnetic radiation 31 with the first spectrum and of the electromagnetic radiation 32 with the second spectrum.

In a switched-off state of the optoelectronic component 100, as shown in FIG. 1B, no electromagnetic radiation 31 with the first spectrum is generated in the active layer 11 of the semiconductor layer sequence 1. However, it is still possible that the optoelectronic component 100 can convey a color impression for an observer, in particular, when observing the radiation output surface 4. This is possible because at least a part of the radiation incident from outside onto the optoelectronic component 100 can be reflected at the optoelectronic component 100, in particular at the wavelength conversion layer 2, the filter layer 3 and/or the semiconductor layer sequence 1. As shown in the exemplary embodiment, at least a part of the radiation 33 that has a spectrum that corresponds to the absorption spectrum of the wavelength conversion layer 2, is converted in the wavelength conversion layer 2 into electromagnetic radiation 32 with the second spectrum, and can be radiated outwards. This can lead to a color impression of the wavelength conversion layer 2 in the switched-off state of the optoelectronic component 100 that is not desired.

As described above, the filter layer 3 can be suited to reflecting a part 34 of the radiation 33 incident from outside onto the optoelectronic component 100. In particular, the spectrum of the part 34 can be selected such that by superposition of the part 34 with the electromagnetic radiation 32 converted by the wavelength conversion layer 2, the undesired color impression that can be generated by the wavelength conversion layer 2, can be avoided. In particular, the filter layer 3 can be constructed such that the part 34 of the radiation 33 irradiated in from outside onto the optoelectronic component 100 that is reflected, has a spectrum that contains one or more spectral components that are contained in the absorption spectrum of the wavelength conversion substance 22. In particular, such spectral components can also be contained in the first spectrum of the electromagnetic radiation 31 generated by the active region 11 of the semiconductor layer sequence 1 during operation.

For this, an arrangement of the filter layer 3 directly above, or at least closely above the wavelength conversion layer 2 can be advantageous, in particular with respect to a compact construction of the optoelectronic component 100 and a homogeneous color impression of the optoelectronic component 100 during operation, as well as in the switched-off state.

In particular, it can also be advantageous if the part 34 of the radiation 33 incident from outside onto the optoelectronic component 100, that is reflected by the filter layer 3, is reflected, as well as the part 312 of the electromagnetic radiation 31 with the first spectrum that is reflected by the filter layer 3, that is, the reflectivity, depends on the angle 9 between the main surface 4 of the filter layer 3 and the direction from which the respective radiation is irradiated onto the filter layer 3. Thus, it can be advantageous, for example, if the reflectivity is smaller for small angles 9, such that electromagnetic radiation 31 with the first spectrum incident on the filter layer 3, and radiation 33 incident from outside onto the optoelectronic component 100 incident at small angles 9, is transmitted more readily than at larger angles, such as at perpendicular incidence.

Purely for exemplary purposes, in the illustrated exemplary embodiment, the electromagnetic radiation 31 with the first spectrum has spectral components, for example, in a blue wavelength range. The wavelength conversion substance 22 of the wavelength conversion layer 2 can be suited to converting at least a part of the electromagnetic radiation 31 with the first spectrum, in particular, spectral components from the blue wavelength range, into electromagnetic radiation 32 with a second spectrum in a yellow wavelength range. Thereby, from the radiation output surface 4 of the optoelectronic component 100, electromagnetic radiation is radiated that creates, for example, a white color impression for an observer. In the switched-off state, the wavelength conversion layer 2, with radiation 33 incident from outside, for example, solar radiation or daylight-like radiation from room lighting can thus convey a yellowish color impression that is undesirable. Therefore, the filter layer 3 can be suited to reflecting, in particular, a part 34 of the radiation 33 incident from outside onto the optoelectronic component 100 with spectral components in a blue wavelength range, so that by the superposition of the yellowish light impression of the wavelength conversion layer 2 and the blueish color impression of the filter layer 3, a whitish color impression of the radiation output surface 4 can in turn be conveyed to an observer. In the process, it is possible that the filter layer 3 also reflects back at least a part, for example 50%, of the electromagnetic radiation 31 with the first spectrum in the direction of the wavelength conversion layer 2.

Due to the wavelength dependent perception of the human eye, that is, due to photometric weighting, it is possible, however, that a reduction of the electromagnetic radiation 31 with the first spectrum emitted by the optoelectronic component 100 in the blue wavelength range, even by 100%, by reflection at the filter layer 3, and a conversion into electromagnetic radiation 32 with the second spectrum in the wavelength conversion layer 2, that the perceived brightness is reduced merely by about 3%.

An optoelectronic component 100 can be suited, for example, as a component for a flash light for a mobile telephone application with a camera. In addition, such an optoelectronic component 100 can also be suited for lighting devices.

In the following, further exemplary embodiments are described whose principle mode of operation corresponds to that of the exemplary embodiment according to the FIGS. 1A and 1B.

Figure 2:
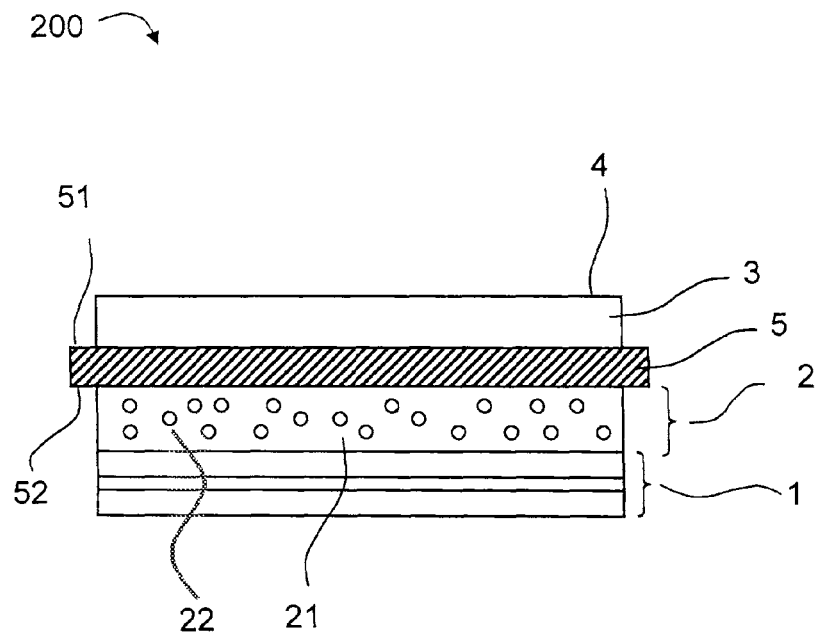

In the exemplary embodiment according to FIG. 2, an optoelectronic component 200 is shown that comprises a substrate 5 with two main surfaces 51, 52 facing away from each other. Preferably, the substrate can be a glass substrate. Alternatively or additionally, the substrate 5 can also comprise further materials, for example, one or more layers composed of a plastic.

The filter layer 3 is applied on the main surface 51 of the substrate 5 facing away from the semiconductor layer sequence 1. In particular, the filter layer 3 can comprise a periodic sequence of first and second layers composed of dielectric materials that can be vapor deposited on the main surface 51 of the substrate 5.

The wavelength conversion layer 2 can be applied onto the main surface 52 facing towards the semiconductor layer sequence 1, where said wavelength conversion layer 2 can have a wavelength conversion substance 22 embedded in a matrix material 21. Alternatively, the wavelength conversion substance 22 can also be applied on the main surface 52 without matrix material 21, and thus, forms the wavelength conversion layer 2.

Figure 3:
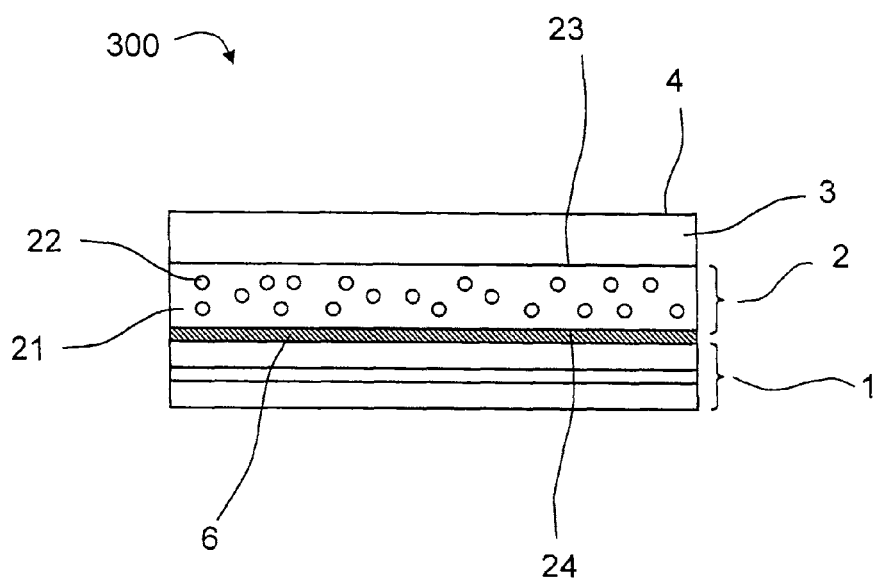

In the exemplary embodiment according to FIG. 3, an optoelectronic component 300 is shown that comprises a film 21 with a wavelength conversion substance 22 as a wavelength conversion layer 2. There, the filter layer 3 is applied, for example, as explained in the preceding exemplary embodiments, onto the main surface 23 of the wavelength conversion layer 2, facing away from the semiconductor layer sequence 1. Further, on the main surface 24 of the wavelength conversion layer 2, facing towards the semiconductor layer sequence 1, a transparent electrically conductive layer 6 is applied, for example, with a transparent electrically conductive oxide. This transparent, electrically conductive layer 6 can enable or facilitate an electrical bonding of the semiconductor layer sequence 1. The transparent, electrically conductive layer 6 can be particularly advantageous when the wavelength conversion substance 22 is applied directly on the semiconductor layer sequence 1.

Figure 4:
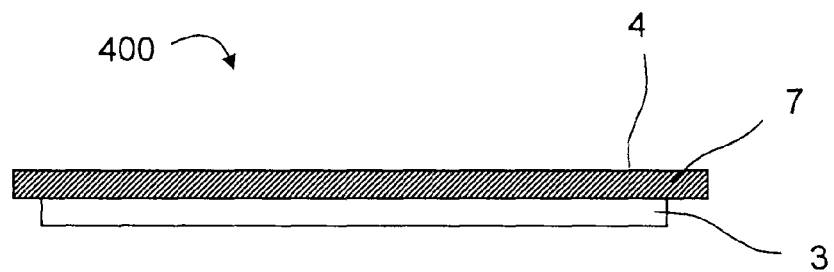
Figure 4:
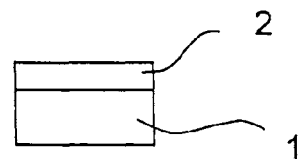

In FIG. 4, an exemplary embodiment is shown for an optoelectronic component 400 that comprises an additional optical component 7. For example, the optical component 7 can be a covering, such as with an integrated lens, for example a microprism structuring. Here, the optical element 7 can be, for example, part of a housing of the optoelectronic component 400. In this case, the filter layer 3 can be applied on the optical element 7 in such a way that the filter layer 3 is not directly or indirectly in contact with the wavelength conversion layer 2.

Figure 5:
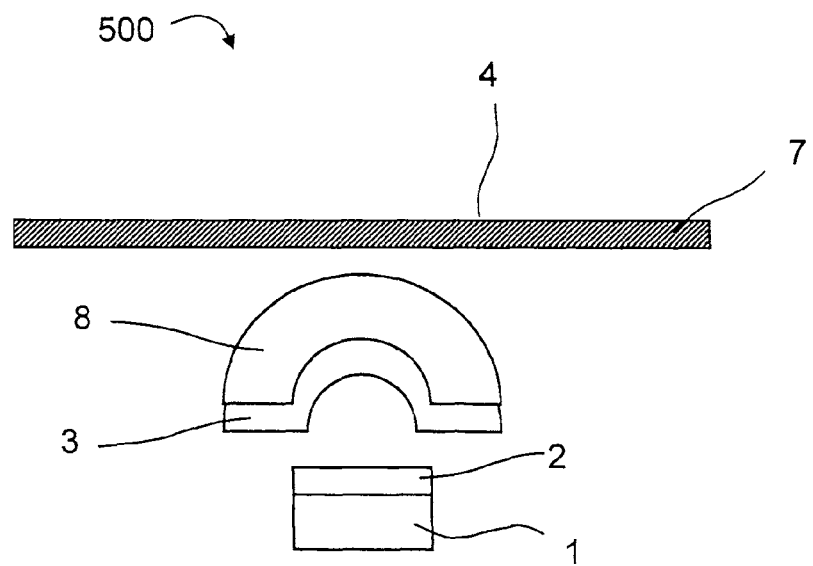

In the exemplary embodiment according to FIG. 5, an optoelectronic component 500 is shown that comprises a further optical element 8 along with the optical element 7 that can be, for example, a covering. The optical element 8 can be, for example, a lens or a different radiation refracting or radiation diffracting optical element. Here, the filter layer 3 can be disposed or applied on a surface of the optical element 8, for example, on the side facing towards the semiconductor layer sequence 1.

In particular, in the exemplary embodiments shown, the wavelength conversion layer 2 and/or the filter layer 3, can also be disposed on several surfaces of the semiconductor layer sequence 1, for example, also on the side surfaces.

The invention is not limited to the embodiments by the fact that the description is based on them. Rather, the invention comprises each new feature, as well as any combination of features, which includes in particular every combination of features in the patent claims, even if this feature or this combination itself is not explicitly specified in the patent claims or exemplary embodiments.

The invention claimed is:

1. An optoelectronic component, comprising
a semiconductor layer sequence with an active region that during operation emits electromagnetic radiation with a first spectrum,
a wavelength conversion layer,
which is disposed downstream from the semiconductor layer sequence in the beam path of the electromagnetic radiation with the first spectrum, and
which at least partially converts electromagnetic radiation with the first spectrum into electromagnetic radiation with a second spectrum, and
a filter layer that reflects, in a switched-off state of the optoelectronic component, at least a part of a radiation incident onto the optoelectronic component from outside, wherein the part of the radiation incident onto the optoelectronic component from outside that is reflected by the filter layer comprises a visible wavelength range and corresponds at least partially to a subspectrum of the electromagnetic radiation with the first spectrum that is converted by the wavelength conversion layer.

2. The optoelectronic component according to claim 1, wherein the filter layer is disposed downstream of the wavelength conversion layer in the beam path of the electromagnetic radiation with the first spectrum.

3. The optoelectronic component according to claim 2, wherein
the optoelectronic component comprises a radiation output surface, and
the radiation incident onto the optoelectronic component from outside is radiated onto the radiation output surface.

4. The optoelectronic component according to claim 1, wherein the first spectrum lies in the visible wavelength range.

5. The optoelectronic component according to claim 1, wherein the filter layer is transparent for a part of the electromagnetic radiation with the first spectrum.

6. The optoelectronic component according to claim 1, wherein the first spectrum comprises a blue wavelength range, and the second spectrum comprises a yellow wavelength range.

7. The optoelectronic component according to claim 6, wherein in a switched-off state the optoelectronic component creates a non-yellowish color impression for an observer.

8. The optoelectronic component according to claim 1, wherein the semiconductor layer sequence is a thin film semiconductor layer sequence.

9. The optoelectronic component according to claim 1, wherein the semiconductor layer sequence comprises a radiation emitting active region that has at least one material with the composition $Al_xIn_yGa_{1-x-y}N$ ($0 \leq x \leq 1$, $0 \leq y \leq 1$, $x+y \leq 1$).

10. The optoelectronic component according to claim 1, wherein the wavelength conversion layer comprises at least one wavelength conversion substance from the group of garnets.

11. The optoelectronic component according to claim 1, wherein the wavelength conversion layer comprises a wavelength conversion substance that is embedded in a matrix material, and the matrix material comprises a transparent plastic.

12. The optoelectronic component according to claim 1, wherein the wavelength conversion layer is applied onto a substrate, and the substrate comprises glass or plastic.

13. The optoelectronic component according to claim 1, wherein the semiconductor layer sequence is constructed as a film.

14. The optoelectronic component according to claim 1, wherein the wavelength conversion layer has an electrically conductive, transparent layer on one side facing towards the semiconductor layer sequence.

15. The optoelectronic component according to claim 14, wherein the electrically conductive transparent layer enables an electrical bonding of the semiconductor layer sequence.

16. The optoelectronic component according to claim 1, wherein the filter layer is constructed as a dichroic mirror.

17. The optoelectronic component according to claim 16, wherein the filter layer comprises a periodic sequence of first layers and second layers, and the first layers have a first refractive index and the second layers have a second refractive index that differs from the first refractive index.

18. The optoelectronic component according to claim 17, wherein the first layers and the second layers of the filter layer respectively each comprise an oxide or nitride.

19. The optoelectronic component according to claim 1, wherein the filter layer comprises a substrate composed of glass or plastic.

20. The optoelectronic component according to claim 1, wherein the filter layer is applied on the wavelength conversion layer.

21. The optoelectronic component according to claim 1, wherein the filter layer is disposed spatially separate from the wavelength conversion layer.

22. The optoelectronic component according to claim 1, wherein
the filter layer has at least one main surface,
the radiation incident onto the optoelectronic component from outside is radiated onto the main surface at an angle, and
the part of the radiation incident from outside onto the optoelectronic component is reflected by the filter layer depending on this angle.

23. The optoelectronic component according to claim 1, wherein the electromagnetic radiation emitted by the optoelectronic component perceived by an observer corresponds to a superposition of the electromagnetic radiation with the first spectrum and the electromagnetic radiation with the second spectrum.

* * * * *